United States Patent [19]
Gaskill et al.

[11] Patent Number: 5,189,413
[45] Date of Patent: Feb. 23, 1993

[54] SCANNING RECEIVER WITH MANUAL OVERRIDE OF FREQUENCY SCANNING ROUTINE

[75] Inventors: Garold B. Gaskill, Tualatin; Daniel J. Park, Portland, both of Oreg.

[73] Assignees: Seiko Corp.; Seiko Epson Corp., both of Japan

[21] Appl. No.: 668,380

[22] Filed: Mar. 12, 1991

Related U.S. Application Data

[63] Continuation of Ser. No. 430,457, Oct. 31, 1989, abandoned, which is a continuation-in-part of Ser. No. 367,014, Jun. 16, 1989, abandoned, and Ser. No. 367,207, Jun. 16, 1989, abandoned, and a continuation-in-part of Ser. No. 352,635, May 12, 1989, Pat. No. 4,897,835, which is a continuation of Ser. No. 121,139, Nov. 16, 1987, abandoned, which is a continuation-in-part of Ser. No. 802,844, Nov. 27, 1985, Pat. No. 4,713,808.

[51] Int. Cl.$^5$ .............................................. H04B 7/00
[52] U.S. Cl. ..................... 340/825.44; 340/825.48; 455/161.1
[58] Field of Search ............... 340/825.44, 825.48, 340/825.08, 32, 33, 825.47, 311.1; 455/32, 33, 343, 32.1, 33.1, 33.2, 161.1; 379/57, 63

[56] References Cited

U.S. PATENT DOCUMENTS

| | | | |
|---|---|---|---|
| 3,755,782 | 8/1973 | Haas et al. | 340/825.08 |
| 4,247,908 | 1/1981 | Lockhart, Jr. et al. | 455/31 |
| 4,419,765 | 12/1983 | Wycoff et al. | 455/161 |
| 4,644,347 | 2/1987 | Lucas et al. | 340/825.44 |
| 4,654,879 | 3/1987 | Goldman et al. | 455/33 |
| 4,710,972 | 12/1987 | Hayashi et al. | 455/161 |
| 4,750,198 | 6/1988 | Harper | 379/63 |
| 4,903,320 | 2/1990 | Hanawa | 455/34 |
| 4,921,464 | 5/1990 | Ito et al. | 379/62 |

*Primary Examiner*—Donald J. Yusko
*Assistant Examiner*—Dervis Magistre
*Attorney, Agent, or Firm*—Elmer Galbi

[57] ABSTRACT

A frequency agile data receiver checks are needed, according to a first protocol, among a plurality of channels to find a channel carrying data. A control activated by the user interrupts this first protocol and institutes a second protocol different than the first. Applied to a paging receiver, the first protocol may sequentially tune the receiver to a plurality of previously identified channels to locate a channel on which paging data is satisfactorily received. The second protocol may sequentially tune to all possible channels to locate such a channel. By this arrangement, a person who knowingly moves to a new locality (e.g., flies to another city) can instruct the paging receiver to abandon a previously identified list of candidate channels and to begin a spectrum-wide scan to locate a new satisfactory paging channels.

9 Claims, 3 Drawing Sheets

SCANNING RECEIVER WITH MANUAL OVERRIDE OF FREQUENCY SCANNING ROUTINE

RELATED APPLICATION DATA

This application is a continuation of application Ser. No. 07/430,457, filed on Oct. 31, 1989, now abandoned, which is a continuation-in-part of co-pending application Ser. No(s). 07/367,014 and 07/367,207, both filed Jun. 16, 1989 and both abandoned, and a continuation-in-part of Ser. No. 352,635, filed May 12, 1989, now U.S. Pat. No. 4,897,835. U.S. Pat. No. 4,897,835 is a continuation of abandoned application Ser. No. 07/121,139, filed Nov. 16, 1987 now abandoned, which in turn was a continuation-in-part of application Ser. No. 06/802,844, filed Nov. 27, 1985, now U.S. Pat. No. 4,713,808. All of these related cases are assigned to the present assignee and are incorporated herein by reference.

BACKGROUND AND SUMMARY OF THE INVENTION

Receivers sometimes include the capability to tune through a number of channels to locate one carrying desired signals. In simple systems, the receiver simply tunes every channel in the spectrum until a channel carrying the desired signals is found. In a more advanced system, disclosed in the above-referenced parent applications in the context of a radio paging system, each transmitter broadcasts a list of alternative channels that are used in the area surrounding the transmitter. On finding one such station, the receiver is provided a small local list of other stations that it can examine for data if the original station is lost, obviating the need to tune through the entire frequency spectrum.

This checking process is energy intensive and reduces the battery life available for the more productive task of receiving pages. If a pager that relies on a local channel list is moved from the geographical area to which the list relates, the pager may exhaust its battery vainly searching for paging signals where there are none. Accordingly, in the system disclosed in the above-referenced applications, after failing to find a paging signal on the channels included on its local list for a predetermined period (37.5 minutes in the illustrated embodiment), the receiver begins a full spectrum scan to find a new paging channel. When it finds a satisfactory paging channel, the pager receives a new local list identifying paging transmitters in that new locality.

While this arrangement greatly reduces battery drain when a pager is moved from one geographical area to another, a period (37.5 minutes) nonetheless elapses during which the pager futilely searches its original (now stale) local channel list looking for paging stations where there are none.

It is an object of the present invention to minimize this futile period, thereby reducing battery drain and increasing message reliability.

BRIEF DESCRIPTION OF THE INVENTION

A frequency agile data receiver searches as needed, according to a first protocol, among a plurality of channels to find a channel carrying data. A control activated by the user interrupts this first protocol and institutes a second protocol different than the first. Applied to a paging receiver, the first protocol may search at a relatively slow rate among a limited group of previously identified channels. The second protocol may scan rapidly through the universe of candidate channels. By this arrangement, a person who knowingly moves to a new locality (e.g., flies to another city) can instruct the receiver to abandon its usual list of channels and to begin a spectrum-wide scan to identify new local paging channels.

DETAILED DESCRIPTION

For expository convenience, the present invention will be illustrated with reference to a paging system (the "Gaskill" system) described in U.S. Pat. No. 4,713,808 and in U.S. Pat. No. 4,897,835. However, it will be recognized that the invention is not so limited.

Figure 1:
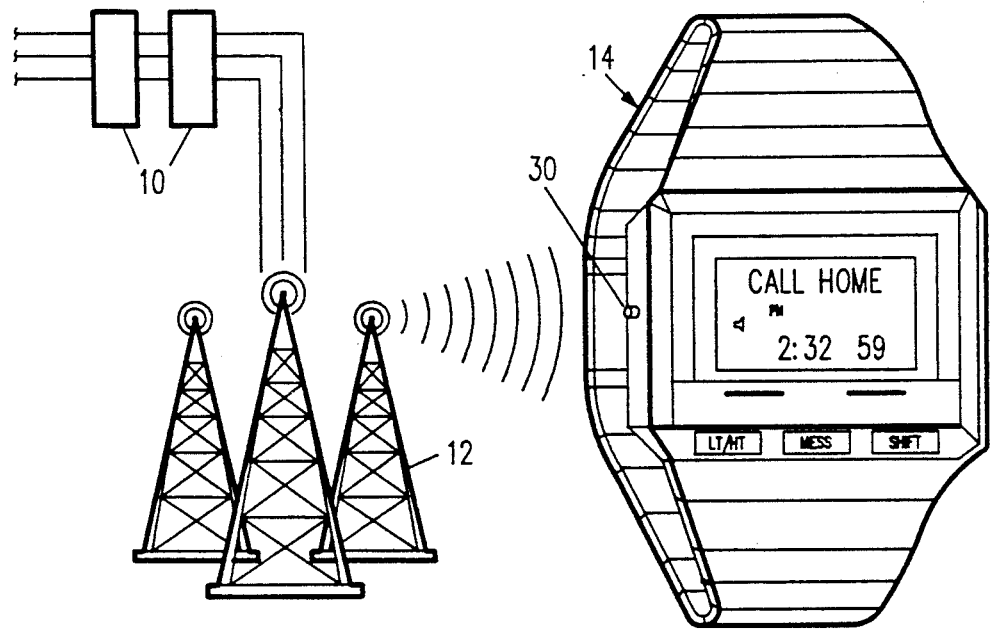
FIG. 1 is a schematic block diagram illustrating a paging system that may use the present invention.

As shown in FIG. 1, the Gaskill system includes clearinghouses 10, broadcasting facilities 12 and wristwatch paging receivers 14. The clearinghouses 10 are fully automated centralized facilities which accept messages, validate customer identification, determine message destinations and route messages to the appropriate broadcast facilities for transmission. Callers to the system dial a local clearinghouse telephone number and hear voice prompts that guide them through a simple process for sending messages.

The broadcast facilities 12 are typically conventional FM broadcast stations that carry paging data on subcarriers of their signals. Multiple stations are used for transmission in a given area. Diversity of signals combined with repeated transmission insures the paging subscribers receive their messages with a high degree of reliability.

Figure 2:
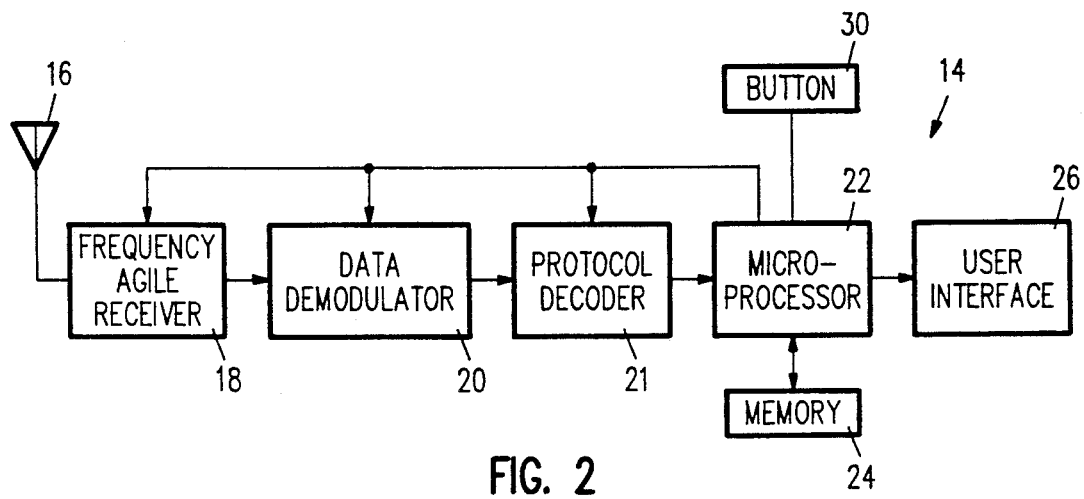
FIG. 2 is a schematic block diagram illustrating a wristwatch paging receiver used in the system of FIG. 1.
Figure 3:
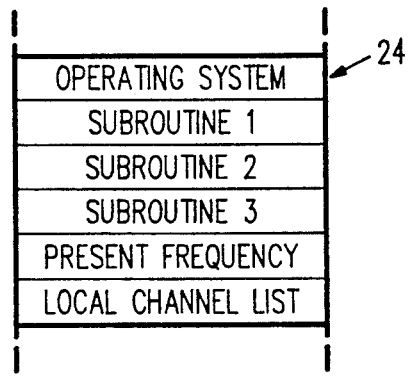
FIG. 3 is a block diagram illustrating the partial contents of a microprocessor memory used in the paging receiver of FIG. 2.

The wristwatch paging receivers 14 are worn by the customers and receive the paging messages broadcast by the broadcast facilities. A block diagram of such a receiver is shown in FIG. 2. The receiver basically includes an antenna 16, a frequency agile receiver 18, a data demodulator 20, a protocol decoder 21, a microprocessor 22 (with associated memory 24) and a user interface 26. Memory 24 contains various data and programs relating to operation of the watch, such as a subroutine for finding a new station, a subroutine for obtaining a local channel list, a datum indicative of the frequency to which the watch is presently tuned, and a local channel list. FIG. 3 illustrates some of the contents of this memory 24.

To review operation of the receiver briefly, antenna 16 receives radio frequency signals in the desired reception band (here 88 to 108 MHz) and couples them to the frequency agile receiver 18. The frequency agile receiver 18 processes the RF signals from the antenna and produces baseband output signals corresponding to a desired FM station within the reception band—typically an FM signal carrying the paging data on an SCA subcarrier thereof. This SCA paging data is detected by the data demodulator 20, decoded by the protocol decoder 21 and is provided to the microprocessor 22 for processing. The microprocessor 22 drives the user interface 26 to alert the user of paging messages.

As described in greater detail in the above-referenced parent applications, local channel lists are transmitted to the pagers and provide a list of alternative channels to which the pager can refer if the channel presently being received becomes unreliable. For background, it may be helpful to review the disclosures of these applications.

The paging signals received by the receiver 14 are formatted as sequences of packets. The first three packets of each sequence are termed "control" packets. The first of the control packets is termed the "control 0" packet and contains the date and time and the first entry of the channel list. The second packet is termed the "control 1" packet and contains the other entries in the channel list. The third packet is a spare. These three control packets are followed by 1024 "data" packets in which the paging data is transmitted. Subsequent sequences are similarly formatted. A new sequence (or "subframe") of 1027 packets is transmitted every 14.0625 seconds.

Before proceeding, it may be helpful to clarify a distinction between the words "search" and "scan" as that terminology is used herein. A "search" is an operation in which the receiver sequentially checks a plurality of previously identified channels (i.e. channels that have been identified by a local channel list) for a desired signal. A "scan," in contrast, is an operation in which the receiver tunes through all possible channels looking for a desired signal, without regard to whether any has been previously identified.

When a paging receiver is newly-energized, it first begins a spectrum-wide scan for a station carrying the paging data. When such a station is found, the receiver decodes the first and second packets and stores the local channel list contained therein into microprocessor memory 24. Thereafter, the receiver continues to operate on the original channel until there is a failure in reception, such as receipt of a packet with uncorrectable errors. When such an event occurs, the receiver searches among other channels in the local list until good data is again received.

Figure 4:
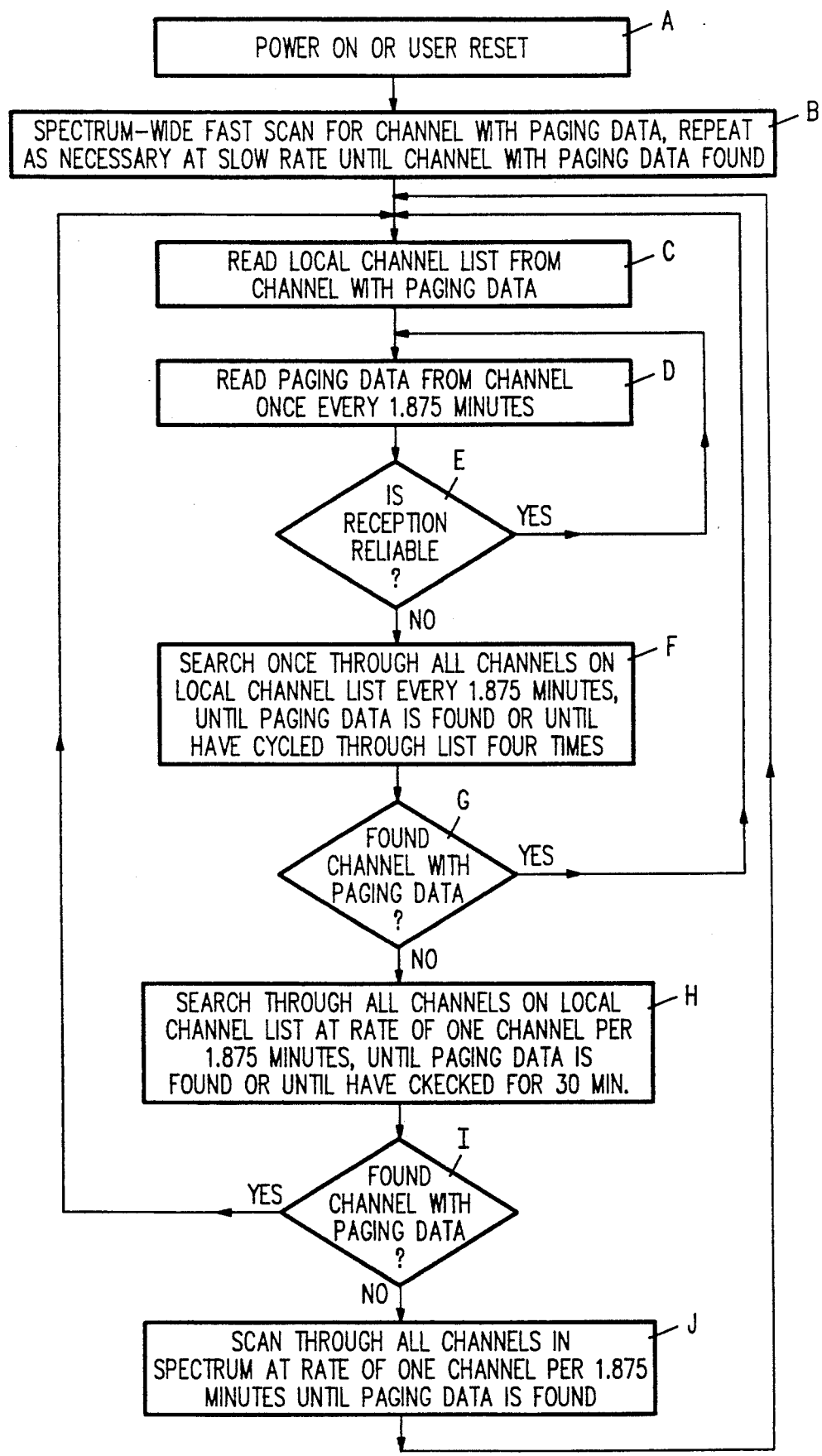
FIG. 4 is a flow chart illustrating operation of the paging system of FIG. 1.

This procedure is illustrated in FIG. 4. On power-on (Step A), the microprocessor 22 causes the frequency agile receiver 18 to begin a fast scan of the entire FM broadcast spectrum, 88.1 to 107.9 MHz in increments of 0.2 MHz, until a channel with paging data is located (Step B). When such a channel is located, the receiver reads the local channel list transmitted in the control 0 and control 1 packets thereof and stores the list in memory 24 (Step C). Thereafter, the receiver momentarily energizes once every 1.875 minutes to listen for paging messages directed to the receiver's user (Step D). As long as reception on this channel continues to be reliable, the receiver stays in this low energy mode of operation, simply listening periodically for paging messages (Step E).

If the user moves the receiver 14 to a new location in which reception is impaired, the receiver will detect the loss of paging data utilizing a CRC error. This error prompts the microprocessor 22 to begin a search through the channels listed in the local channel list for an alternative source of paging signals (Step F). The transmission on these channels are generally all time-staggered relative to one another, so the receiver can tune to the first alternative channel for a given frame of information and, if unsuccessful, can tune to the next alternative channel, and so forth, all within the frame period of 1.875 minutes. In the illustrated embodiment, this search continues for four complete cycles through the local channel list (i.e., a maximum period of 7.5 minutes) looking for paging data.

If the receiver's loss of the original signal was caused by some transitory effect, such as a momentary incident of multipath while the user drove between buildings in a downtown area, the receiver quickly resumes reception of paging signals, generally without loss of a single frame of data since each channel transmits each frame in time-staggered relation (Step G). If, however, the receiver has not reacquired a paging signal within this 7.5 minute search time, the microprocessor presumes the signal loss is not of momentary duration and ceases the receiver's relatively high energy search operation. (If there are seven stations in the local channel list, the energization of the receiver seven times every 1.875 minutes during this operation consumes power at a rate of seven times that consumed during normal operation, in which the receiver is energized only once every 1.875 minutes.)

If the microprocessor concludes that the loss of signal is not merely transitory, it may optionally continue its searching though the local channel list, but at a slower rate, such as one channel every 1.875 minutes (Step H). This operation consumes power at the same rate as the normal receiving mode of operation, yet concentrates the search among the channels most likely to be carrying paging signals. In the illustrated embodiment, this slower searching mode continues for 30 additional minutes.

If no paging signal is located using the above procedures (Step I), the microprocessor then instructs the frequency agile receiver to institute a spectrum-wide scan for paging data (Step J). This scan is desirably conducted at a relatively slow rate, such as one channel every 1.875 minutes, to conserve battery power. If desired, the microprocessor can be programmed to begin this mode of operation with one fast scan through the spectrum, and thereafter continue the scan at the more relaxed pace. This low energy scan continues until a paging signal is finally found.

By the foregoing arrangement, a paging receiver is able to quickly recover from transitory conditions that render a particular transmission unreliable simply by switching to another of the channels previously identified in the local channel list. If a signal failure cannot be quickly cured by resort to one of these other channels, the receiver reduces battery drain by searching among the listed channels more slowly. If this limited search continues to prove unavailing, the receiver begins scanning the entire spectrum, but at a rate that consumes little battery energy. Thus, the battery energy is expended where it is most likely to do the most good, with a high energy search among the most likely channels and a progressively lower energy search or scan as the likelihood of quickly finding a station diminishes.

While this arrangement greatly reduces battery drain when a pager is moved from one geographical area to another, a period (37.5 minutes) may nonetheless elapse during which the pager vainly searches its original (now stale) local channel list looking for paging stations where there are none. According to the present invention, the paging receiver 14 is provided with a button 30 (FIGS. 1 and 2) that can be activated by the user to cause the receiver to interrupt its normal searching mode of operation and institute a scanning operation instead. In the scanning mode, the receiver undertakes a sweep of the spectrum, according to a protocol different than that normally used, for a channel carrying paging data. (The normal protocol is considered to be the series of steps following the first failure to receive paging data in the block entitled "Is Reception Reliable?" in FIG. 4, i.e., steps F et. seq. In particular, the receiver does not initially limit itself to the previously identified channels stored in the local channel list. Rather, it sweeps spectrum-wide. Further, it is at a rate greater than that used in the normal protocol (one channel per second in the illustrated embodiment, as opposed to the one channel per 1.875 minute rate used in the normal protocol). On locating a channel carrying paging data, the receiver obtains a new local list identifying other channels carrying paging data in the receiver's locale. (Again, if desired, the receiver can begin this fast-scan operation with a just single fast sweep through the spectrum and thereafter continue the spectrum-wide scanning at a slower rate.)

Figure 5:
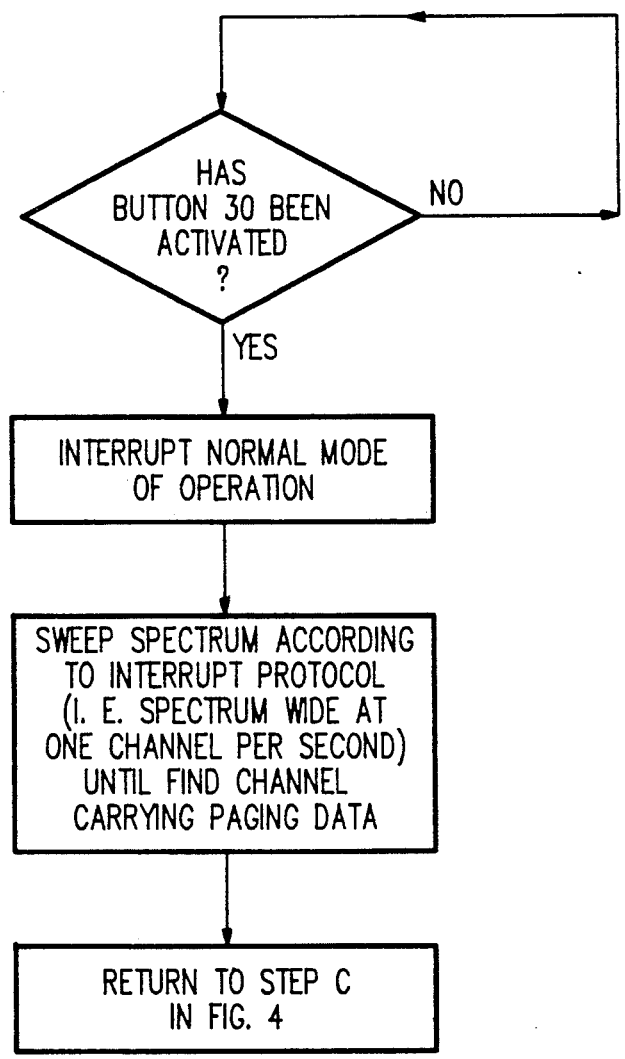
FIG. 5 shows the method of interrupting the normal mode of operation.

By the foregoing arrangement, as shown in FIG. 5, a person who knowingly moves to a new locality (e.g., flies to another city) can instruct the receiver to begin a fast spectrum-wide scan to locate a paging channel immediately, without first having to wait for the pager's previous local channel list to prove ineffective.

Having described and illustrated the principles of our invention with reference to a preferred embodiment and several variations thereon, it will be apparent that the invention can be modified in arrangement and detail without departing from such principles. For example, while the invention has been illustrated by a system in which a search mode of operation is interrupted by a scan mode of operation, other variations are of course possible, as illustrated in the following table:

| NORMAL | | INTERRUPT | |
|---|---|---|---|
| Seed | Spectrum | Speed | Spectrum |
| 1. Slow | Limited | Fast | Limited |
| 2. Slow | Limited | Fast | Full |
| 3. Slow | Limited | Slow | Full |
| 4. Slow | Full | Fast | Limited |
| 5. Slow | Full | Fast | Full |
| 6. Slow | Full | Slow | Limited |
| 7. Fast | Limited | Fast | Full |
| 8. Fast | Limited | Slow | Full |
| 9. Fast | Limited | Slow | Limited |
| 10. Fast | Full | Fast | Limited |
| 11. Fast | Full | Slow | Full |
| 12. Fast | Full | Slow | Limited |

Different ones of the foregoing variations may be advantageous for different applications. For example, it may be advantageous to optionally invoke a slow search routine to conserve battery power.

In view of the foregoing and the many other modifications that may be made to the present invention, it should be recognized that the detailed embodiment is illustrative only and should not be considered to restrict the invention's scope. Instead, we claim as our invention all such embodiments as may come within the scope and spirit of the following claims and equivalents thereto.

We claim:

1. A method of operating a frequency agile data receiver capable of operating over a wide frequency range, said receiver having stored therein a short list of local data channels, said method including a first mode of operation and a fast scan mode of operation, (a) said first mode of operation having awake and asleep phases, and comprising the steps of:
   a1) periodically awakening briefly from said asleep phase and listening for data signals on a first data channel;
   a2) if no data signal is received on said first data channel, then checking among said stored short list of local data channels using a fast high energy utilizing first channel locating protocol to locate a data channel on which data can be received; and
   a3) if no data channel is found on which data can be received, switching to a slow low energy utilizing second channel locating protocol and slowly scanning through said wide frequency range at a slow rate to find a data channel on which data can be received, and
(b) said fast scan mode of operation comprising the steps:
   b1) providing a manually induced stimulus to said receiver which interrupts said first mode of operation; and
   b2) initiates checking among said wide frequency range using a fast relatively high energy utilizing third channel locating protocol to locate a data channel on which data can be received,
   whereby in response to said manual stimulus said receiver is switched to said high energy utilizing third data channel locating protocol.

2. The method of claim 1, in which said short local list has less data channels therein than are operating in said wide frequency range.

3. The method of claim 1, in which the manually induced stimulus comprises activation of a button on the paging receiver.

4. The method of claim 1 in which the first protocol includes searching through groups of data channels successively less likely to be carrying data at successively slower rates to locate a data channel on which data is satisfactorily received.

5. The method of claim 1 in which the first protocol comprises:
   sequentially checking through a first plurality of data channels at a first rate to locate a data channel on which data is satisfactorily received; and
   if the above step is unsuccessful within an interval of time, then sequentially checking through a second plurality of data channels at a second rate slower than the first to locate a data channel on which data is received.

6. The method of claim 1 in which said third protocol includes checking through a spectrum of candidate data channels at a rate greater than a rate used in the first protocol.

7. The method of claim 1 in which the first protocol includes checking at a plurality of rates and in which said third protocol includes checking at a rate greater than or equal to the fastest rate used in the first protocol.

8. The method of claim 1 in which the first protocol includes searching among previously identified data channels, and said third protocol includes scanning among a universe of candidate data channels.

9. The method of claim 1 in which the data receiver is a paging receiver and in which:
   the manually induced stimulus comprises activation of a button on the receiver;
   the first protocol includes searching among the first plurality of paging data channels at a first rate; and
   the second protocol includes scanning among a second plurality of paging data channels more numerous than the first plurality at a second rate greater than the first rate.

* * * * *